(12) United States Patent
Hao et al.

(10) Patent No.: US 6,984,566 B2
(45) Date of Patent: Jan. 10, 2006

(54) DAMASCENE GATE PROCESS

(75) Inventors: Chung-Peng Hao, Taipei (TW); Yi-Nan Chen, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 71 days.

(21) Appl. No.: 10/715,658

(22) Filed: Nov. 18, 2003

(65) Prior Publication Data
US 2005/0032359 A1    Feb. 10, 2005

(30) Foreign Application Priority Data
Aug. 8, 2003   (TW) .............................. 92121765 A

(51) Int. Cl.
*H01L 21/336*    (2006.01)

(52) U.S. Cl. ........................ 438/305; 438/301; 257/408

(58) Field of Classification Search ................ 257/368, 257/408; 438/301, 306, 424
See application file for complete search history.

(56) References Cited

U.S. PATENT DOCUMENTS

| | | | |
|---|---|---|---|
| 6,475,916 B1 * | 11/2002 | Lee et al. ................... | 438/706 |
| 6,566,215 B1 * | 5/2003 | Chong et al. ............... | 438/305 |
| 6,674,139 B2 * | 1/2004 | Mandelman et al. ....... | 257/412 |
| 2004/0135212 A1 * | 7/2004 | Dokumaci et al. .......... | 257/376 |

\* cited by examiner

*Primary Examiner*—Christian D. Wilson
(74) *Attorney, Agent, or Firm*—Quintero Law Office

(57) ABSTRACT

The invention provides a damascene gate process. A semiconductor substrate having a pad layer and an etch stop layer formed thereon is provided, and an insulating layer is formed to cover the etch stop layer, followed by forming an opening by partially removing the insulating layer, the etch stop layer, and the pad layer. A protective spacer is formed on the sidewall of the opening, wherein the top of the protective spacer is lower than the insulating layer. A gate conducting layer is then formed in the opening. The protective spacer and the insulating layer are removed to expose a portion of the semiconductor substrate and the etch stop layer. Implantation is then performed to form lightly doped drains. A gate spacer is then formed to cover the gate conducting layer. The etch stop layer and the pad layer are removed, and implantation is then performed to a form source/drain.

22 Claims, 5 Drawing Sheets

DAMASCENE GATE PROCESS

BACKGROUND OF THE INVENTION

1. Field of the Invention

The invention relates to a damascene gate process, and more particularly to a process of forming damascene gates with a line width of 0.11 µm.

2. Description of the Related Art

As semiconductor manufacturing techniques have advanced, MOS gate length has scaled down to 100 nm, and the gate oxide layer is less than 3 nm thick. The conventional method of fabricating a gate is described in following. Shallow trench isolations (STI) are formed by $SiO_2$ in the silicon substrate to define an active area. A gate oxide layer and a poly layer are sequentially formed and planarized. A mask layer is formed to cover the poly layer. The poly layer is defined as a poly gate by photolithography and etching. The substrate is implanted to form a lightly doped drain (LDD), and spacers are then formed.

Deposition, photolithography, and etching are performed repeatedly in the conventional process, thus fabrication costs cannot be reduced. When the polysilicon layer and the oxide layer with the exception of the active area are removed, the oxide layer is easily over-etched, damaging the silicon substrate under the oxide layer, thus other layers formed there on are not uniform. If the polysilicon layer and the oxide layer with the exception of the active area are not completely removed, stringers remain between gates or the gate and the bit line, thus short circuits occur in the gates.

SUMMARY OF THE INVENTION

The present invention is directed to a damascene gate process, after defining an active area by shallow trench isolation structures, an opening of a predetermined size is formed, the size of the opening is then reduced by forming a protective spacer, and the opening is filled to complete the damascene gate process.

Accordingly, the present invention provides a damascene gate process. A semiconductor substrate having a pad layer and a etch stop layer formed thereon is provided. An insulating layer is formed to cover the etch stop layer. An opening is then formed by partially removing the insulating layer, the etch stop layer, and the pad layer. A protective spacer is formed on the sidewall of the opening, wherein the top of the protective spacer is lower than the insulating layer. A gate conducting layer is formed in the opening. The protective spacer and the insulating layer are removed to expose a portion of the semiconductor substrate and the etch stop layer. The exposed semiconductor substrate is implanted forming lightly doped drains thereon. A gate spacer is formed to cover the gate conducting layer. The etch stop layer and the pad layer are removed to expose portions of the semiconductor substrate. The exposed semiconductor substrate is implanted, forming a source/drain thereon.

The present invention provides an additional damascene gate process. A semiconductor substrate having a plurality of shallow trench isolation (STI) structures is provided, and an STI protective layer is formed on each of the STI structures. A pad layer and an etch stop layer are sequentially formed between the STI structures. An insulating layer is formed to cover the STI structures and the etch stop layer. An opening is formed between the structures be partially removing the insulating layer, the etch stop layer, and the pad layer. A protective spacer is formed on the sidewall of the opening, wherein the tops of the protective spacers are lower than the insulating layer. Dissimilar conducting layers are formed, acting as agate conducting layer, in the bottom of the opening. The protective spacer and the insulating layer are removed to expose a portion of the semiconductor substrate and the etch stop layer. The exposed semiconductor substrate is implanted to form lightly doped drains beside the gate conducting layer. A gate spacer is formed to cover the gate conducting layer. The etch stop layer and the pad layer are removed. The exposed semiconductor substrate is implanted forming a source/drain therein.

BRIEF DESCRIPTION OF THE DRAWINGS

For a better understanding of the present invention, reference is made to a detailed description to be read in conjunction with the accompanying drawings, in which.

DETAILED DESCRIPTION OF THE INVENTION

Figure 1A:
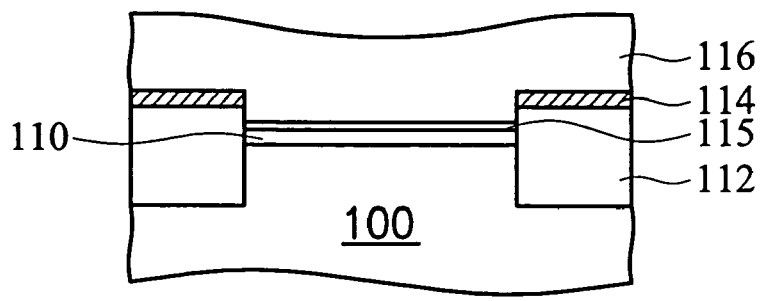
FIGS. 1A to 1O are cross-sections of the damascene gate process of the present invention.
Figure 1B:
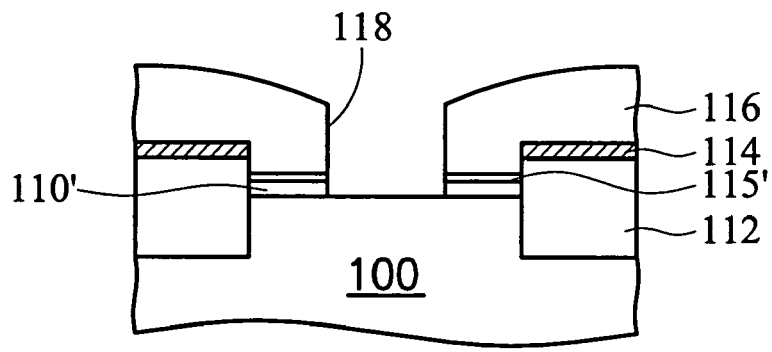
Figure 1C:
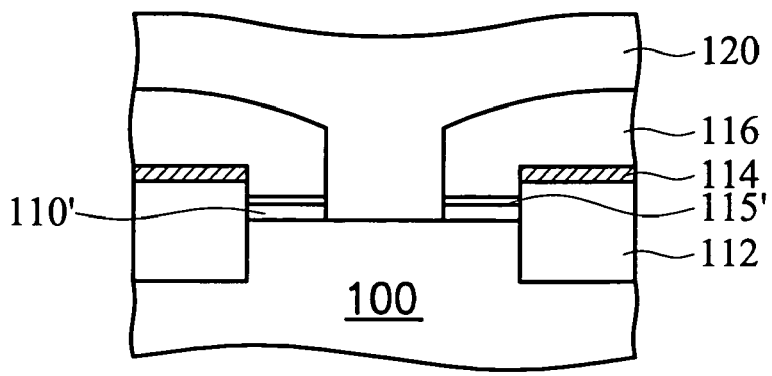
Figure 1D:
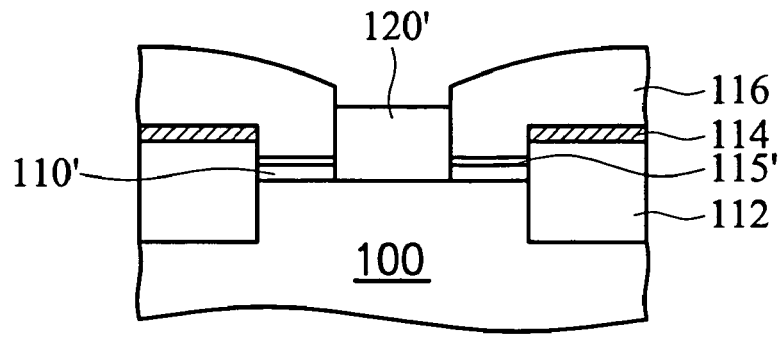
Figure 1E:
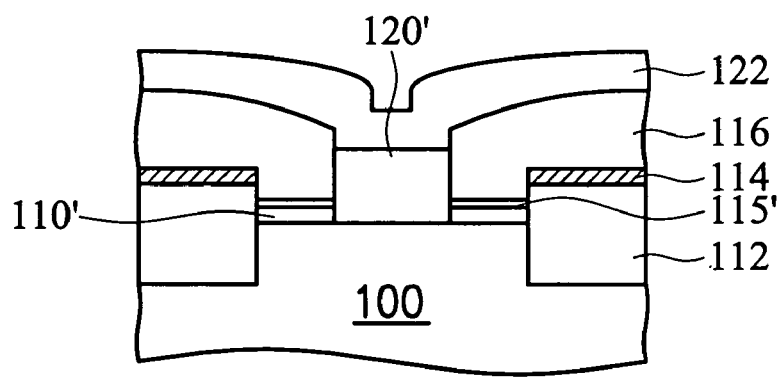
Figure 1F:
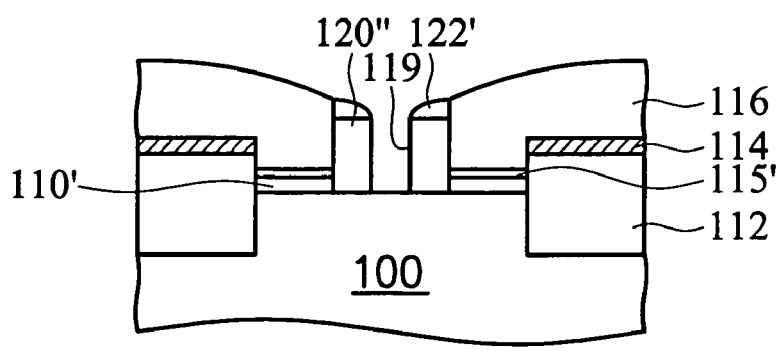
Figure 1G:
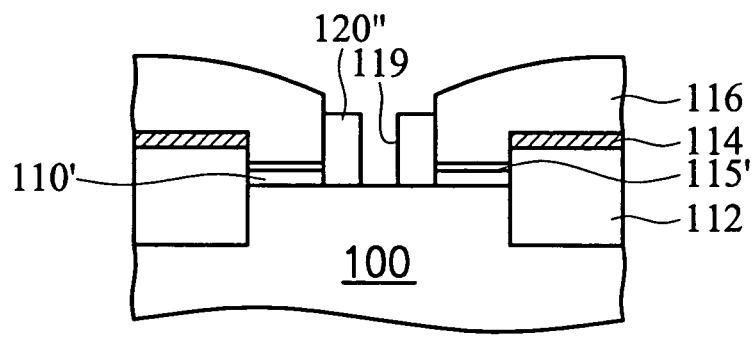
Figure 1H:
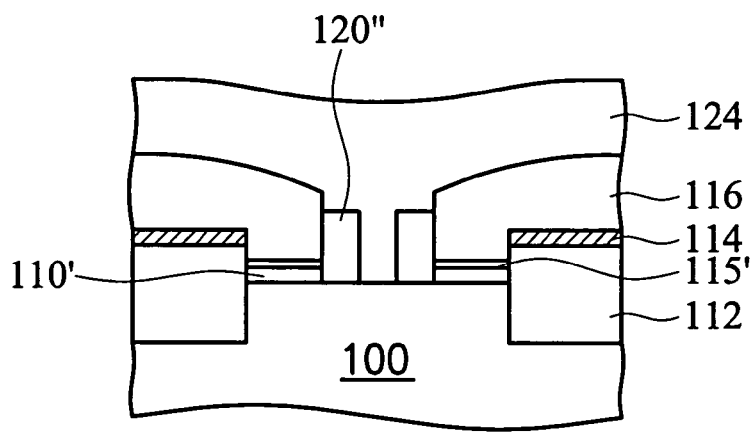
Figure 1I:
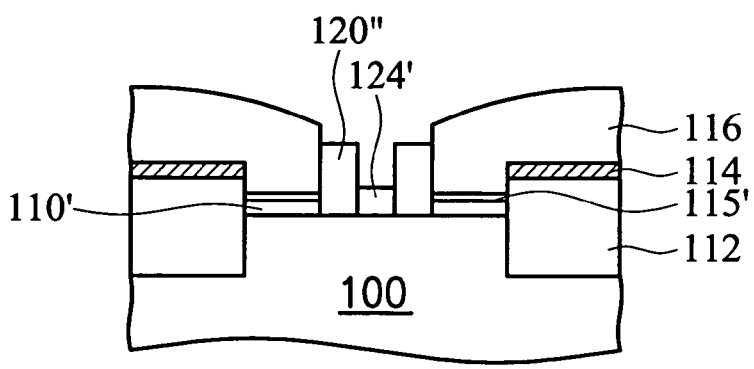
Figure 1J:
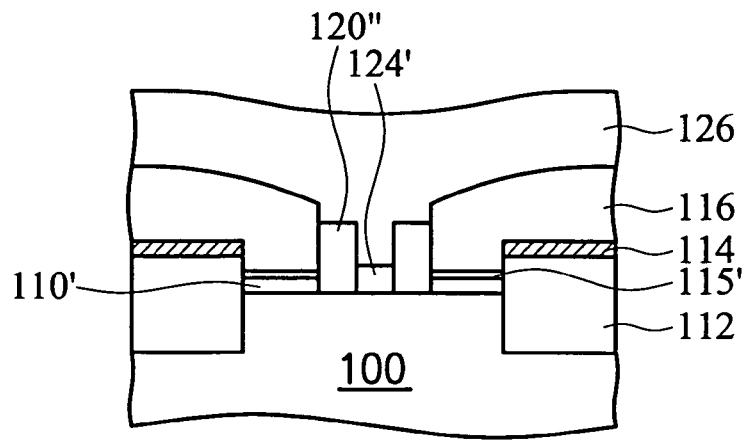
Figure 1K:
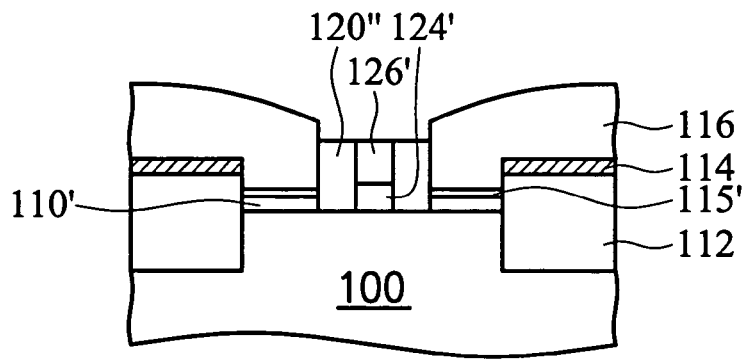
Figure 1L:
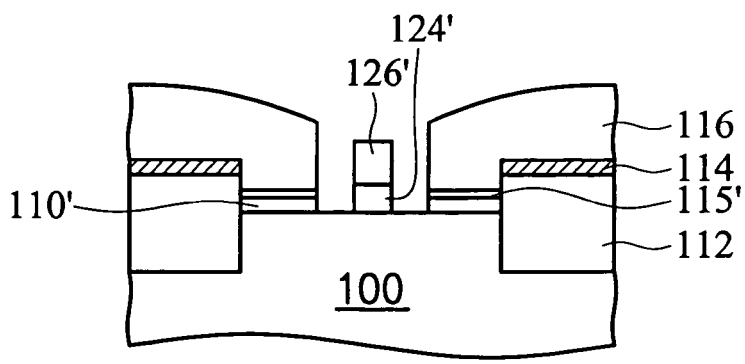
Figure 1M:
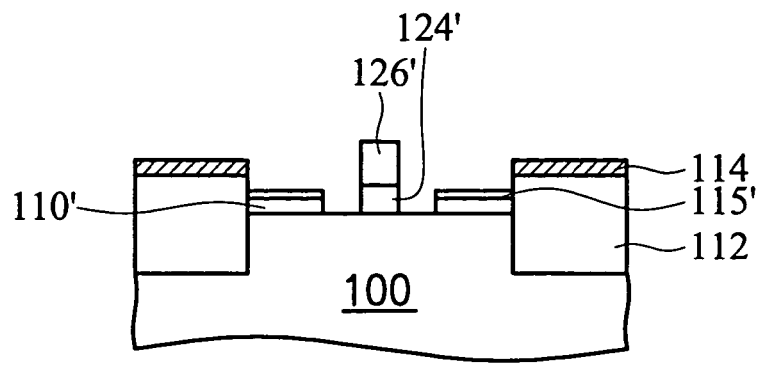
Figure 1N:
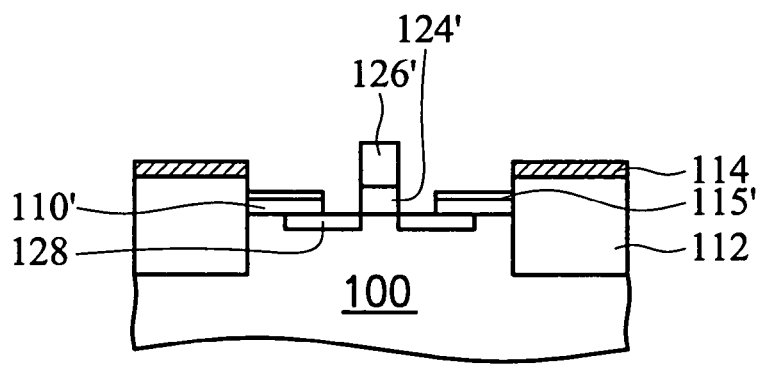
Figure 1O:
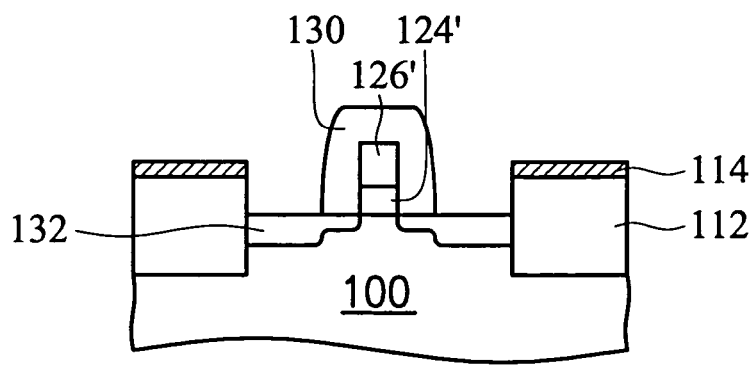

FIGS. 1A to 1O are cross-sections of the damascene gate process of the present invention.

In FIG. 1A, a semiconductor substrate 100 having a pad layer 110, such as an oxide layer, is provided, in which two shallow trench isolations (STI) 112, such as oxide layers, are formed in predetermined regions to define an active area. An STI protective layer 114 of dielectric material, such as nitride, is formed on each STI 112. In this invention, the STI protective layer 114 can be formed by LPCVD using $SiCl_2H_2$ and $NH_3$ as reaction sources at a temperature of 250 to 400° C.

In FIG. 1B, a etch stop layer 115, such as silicon nitride, is formed on pad oxide layer 110 in the active area, and an insulating layer 116, such as tetraethylorthosilane (TEOS), is formed by chemical vapor deposition (CVD) or thermal oxidation. A patterned photoresist layer having an opening is formed on the insulating layer 116. The insulating layer 116 and the pad oxide layer 110 are sequentially etched until the semiconductor substrate is exposed to form an opening 118.

In FIG. 1C, a sacrificial layer 120 is formed to cover the insulating layer 116 and fill in the opening 118. In this invention, the sacrificial layer 120 can be formed by LPCVD using $SiCl_2H_2$ and $NH_3$ as reaction sources at a temperature of 250 to 400° C. The sacrificial layer 120 is subject to chemical mechanical polishing (CMP) or etching to remove the portion of the sacrificial layer 120 covering the insulating layer 120, thus, sacrificial layer 120' is lower than the insulating layer 116 as shown in FIG. 1D.

In FIG. 1E, a material of high etch selectivity with respect to the sacrificial layer, such as a poly layer 122, is conformably formed to cover the insulating layer 116 and the sacrificial layer 120'. In this invention, the sacrificial layer 120 can be formed by LPCVD using a mixture of materials containing silicon, such as $SiCH_4$, as reaction sources at a temperature of 530 to 650° C.

In FIG. 1F, a patterned photoresist layer defining a gate area is formed. The poly layer and the sacrificial layer are etched to form an opening 119. After etching the poly layer 122' and the protective spacer 120'' remain, and the size of the opening is reduced to 0.09 µm.

In FIG. 1G, the remained poly layer 122' is wet etched by $NH_4OH$.

In FIG. 1H, a gate dielectric layer, such as a thin $SiO_2$ layer, is formed on the exposed semiconductor substrate by thermal oxidation. A first conducting layer 124, such as a poly layer, is fully formed to cover the insulating layer 116 and fill in the opening 119.

In FIG. 1I, the first conducting layer 124 is subject to CMP or etching to form an N+ type poly layer 124'. In this invention, the thickness of the first conducting layer 124' is 2500 to 5000 Å, and can be formed by LPCVD at a temperature of 530 to 650° C. For an N+ type element, the poly layer can be doped in situ in a gas mixture containing $SiH_4$, phosphine or arsine. The doped poly layer also can be formed by implanting phosphorous or arsenic ions into the poly layer.

In FIG. 1J, a conducting layer 126, such as W, silicide, or $WSi_x$ layer, acting as a gate conducting layer is formed to cover the insulating layer 116 and fill in the opening 119. In this invention, the thickness of the conducting layer 126 is 1500 to 4500 Å, and can be formed by LPCVD using $SiH_4$ or $SiCl_2H_2$ (DCS) and $WF_6$ as reaction sources at a temperature of 300 to 600° C. under pressure of 100 to 500 mTorr.

In FIG. 1K, the conducting layer 126 is subject to CMP or etching to form a conducting layer 126', and the height of the conducting layer 126' is either equal or unequal to the protective spacer 120".

In FIG. 1L, the protective layer 120" is removed by dry etching, and a laminated construction acting as a damascene gate conducting layer consists of the first conducting layer and the second conducting layer.

In FIG. 1M, the insulating layer 116 is removed by HF or BHF.

In FIG. 1N, the exposed semiconductor substrate is implanted with 10 keV acceleration energy and a $1\times10^{13}$ to $3\times10^{13}$ $cm^{-2}$ dose to form lightly doped drains (LDD) 128 beside the laminated construction.

In FIG. 1O, a dielectric layer acting as a gate spacer 130, such as a silicon nitride layer, is formed, the pad layer 115' and 110' are removed, and source/drain 132 are formed in the semiconductor substrate by implantation, thus a damascene gate process is complete.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A damascene gate process, comprising:
   providing a semiconductor substrate having a pad layer and a etch stop layer formed thereon;
   forming an insulating layer to cover the etch stop layer;
   forming an opening by partially removing the insulating layer, the etch stop layer, and the pad layer;
   forming a protective spacer on the sidewall of the opening, wherein the tops of the protective spacer are lower than the insulating layer;
   forming a gate conducting layer in the opening;
   removing the protective spacer and the insulating layer to expose a portion of the semiconductor substrate and the etch stop layer;
   implanting the exposed semiconductor substrate to form lightly doped drains;
   forming a gate spacer to cover the gate conducting layer;
   removing the etch stop layer and the pad layer to expose portions of the semiconductor substrate; and
   implanting the exposed semiconductor substrate to form source/drain.

2. The damascene gate process of claim 1, wherein the pad layer is an oxide layer.

3. The damascene gate process of claim 1, wherein the etch stop layer is a nitride layer.

4. The damascene gate process of claim 1, wherein the insulating layer is a tetraethylorthosilane layer.

5. The damascene gate process of claim 1, wherein the protective spacer are nitride layers.

6. The damascene gate process of claim 1, wherein the gate conducting layer is a laminated construction with two conducting layers.

7. The damascene gate process of claim 6, wherein the conducting layer is a poly layer, a SiW layer, a W layer, or a suicide layer.

8. The damascene gate process of claim 1, wherein the gate spacer is a nitride layer.

9. The damascene gate process of claim 1, before the step of forming the gate conducting layer, further comprising a step of forming a gate oxide layer on the exposed semiconductor substrate of the bottom opening.

10. The damascene gate process of claim 1, wherein the insulating layer is removed by HF or BHF.

11. A damascene gate process, comprising:
    providing a semiconductor substrate having a plurality of shallow trench isolation (STI) structures, an STI protective layer is formed on each of the STI structures;
    sequentially forming a pad layer and an etch stop layer between the STI structures;
    forming an insulating layer to cover the STI structures and the etch stop layer;
    forming an opening between the structures by partially removing the insulating layer, the etch stop layer, and the pad layer;
    forming a protective spacer on the sidewall of the opening, wherein the tops of the protective spacer are lower than the insulating layer;
    forming dissimilar conducting layers acting as gate conducting layer in the bottom of the opening;
    removing the protective spacer and the insulating layer to expose a portion of the semiconductor substrate and the etch stop layer;
    implanting the exposed semiconductor substrate to form lightly doped drains beside the gate conducting layer;
    forming a gate spacer to cover the gate conducting layer;
    removing the etch stop layer and the pad layer; and
    implanting the exposed semiconductor substrate to form source/drain.

12. The damascene gate process of claim 11, wherein the STI structures are oxide layers.

13. The damascene gate process of claim 11, wherein the STI protective layer is a nitride layer.

14. The damascene gate process of claim 11, wherein the etch stop layer is a nitride layer.

15. The damascene gate process of claim 11, wherein the insulating layer is a tetraethylorthosilane layer.

16. The damascene gate process of claim 11, wherein the protective spacer is a nitride layer.

17. The damascene gate process of claim 11, wherein the gate spacer is a nitride layer.

18. The damascene gate process of claim 11, wherein the gate conducting layer is a laminated construction with two conducting layers.

19. The damascene gate process of claim 18, wherein the conducting layer is a poly layer, a SiW layer, a W layer, or a silicide layer.

20. The damascene gate process of claim 11, before the step of forming the gate conducting layer, further comprising a step of forming a gate oxide layer on the exposed semiconductor substrate of the bottom opening.

21. The damascene gate process of claim 11, wherein the insulating layer is removed by HF or BHF.

22. The damascene gate process of claim 11, wherein the pad layer is an oxide layer.

* * * * *